United States Patent
Miyamoto et al.

(10) Patent No.: US 6,189,547 B1
(45) Date of Patent: Feb. 20, 2001

(54) ULTRASONIC WASHING APPARATUS

(75) Inventors: Toshiaki Miyamoto; Shuich Sano, both of Aich-ken (JP)

(73) Assignee: Honda Electronics Co., Ltd., Aichi-ken (JP)

( * ) Notice: Under 35 U.S.C. 154(b), the term of this patent shall be extended for 0 days.

(21) Appl. No.: 09/329,396

(22) Filed: Jun. 10, 1999

(51) Int. Cl.$^7$ .................................................. B08B 3/10
(52) U.S. Cl. ...................... 134/57 R; 134/113; 134/184; 134/902; 134/56 R
(58) Field of Search ............................ 134/56 R, 57 R, 134/58 R, 113, 184, 902, 1.3

(56) References Cited

U.S. PATENT DOCUMENTS

| | | | |
|---|---|---|---|
| 4,326,553 | * | 4/1982 | Hall . |
| 4,403,735 | * | 9/1983 | Weaver . |
| 5,100,476 | * | 3/1992 | Mase et al. . |
| 5,383,483 | * | 1/1995 | Shibano . |
| 5,927,306 | * | 7/1999 | Izumi et al. . |
| 5,975,098 | * | 11/1999 | Yoshitani et al. . |
| 6,003,527 | * | 12/1999 | Netsu . |
| 6,050,276 | * | 4/2000 | Harada . |

FOREIGN PATENT DOCUMENTS

| | | | |
|---|---|---|---|
| 63-266831 | * | 11/1988 | (JP) . |
| 2-90532 | * | 3/1990 | (JP) . |
| 4-213827 | * | 8/1992 | (JP) . |
| 5-175184 | * | 7/1993 | (JP) . |

\* cited by examiner

Primary Examiner—Frankie L. Stinson
(74) Attorney, Agent, or Firm—Burgess, Ryan & Wayne; Milton J. Wayne; William R. Moran

(57) ABSTRACT

A sensor chamber is formed a side portion of a liquid supply inlet of a housing, a sound pressure sensor is mounted in the sensor chamber, ultrasonic waves from an ultrasonic vibrator provided in the housing are detected by the sound pressure sensor, and a defect of the ultrasonic vibrator is detected when the output of the sound pressure sensor becomes less than a predetermined value.

3 Claims, 4 Drawing Sheets

ULTRASONIC WASHING APPARATUS

BACKGROUND OF THE INVENTION

The present invention relates to an ultrasonic washing apparatus having a sound pressure sensor for detecting an ultrasonic wave for washing generated by an ultrasonic vibrator.

In a prior ultrasonic washing apparatus, a housing has a central hollow portion and an inclined hollow portion, A nozzle is formed at the end of the inclined portion, and a step portion is formed in the central hollow portion. An ultrasonic vibrator is mounted on the step portion, A high frequency oscillator is connected to the ultrasonic vibrator through connected lines, and a liquid flowing inlet is connected to the central hollow portion of the housing and to a liquid supply means.

When a liquid as a washing liquid is supplied to the housing by the liquid supply means and the oscillating output from the high frequency oscillator is applied to the ultrasonic vibrator, liquid with ultrasonic waves flows from the nozzle of the housing, and a surface of an object such as a semiconductor placed in the front of the nozzle is washed by the liquid and ultrasonic waves.

In this ultrasonic washing apparatus, since a sound pressure sensor is large, the sound pressure sensor must be placed at the position of the object for detecting the ultrasonic waves in the liquid flowing from the nozzle of the housing, and the voltage detected by. the sound pressure sensor is measured by a voltmeter.

Therefore, the ultrasonic waves in the liquid cannot be detected by the sound pressure sensor when the object is washed.

SUMMARY OF THE INVENTION

It is, therefore, the primary object of the present invention to provide an ultrasonic washing apparatus having a sound pressure sensor for detecting ultrasonic waves when an object is washed.

It is another object of the present invention to provide an ultrasonic washing apparatus in which the sound pressure sensor is installed in a housing having a nozzle.

In order to accomplish the above and other objects, the present invention comprises a housing having a central hollow portion providing a liquid supplying inlet and a sensor chamber and an inclined hollow portion, one end of which is connected to the central hollow portion and the other end of which forms a nozzle, an ultrasonic vibrator fixed on the step portion of the end of the central hollow portion, a sound pressure sensor attached to the sensor chamber, a high frequency oscillator connected to the ultrasonic vibrator, a receiving means connected to the sound pressure sensor, and a voltmeter connected to the receiving means.

DESCRIPTION OF THE PREFERRED EMBODIMENTS

Figure 1:
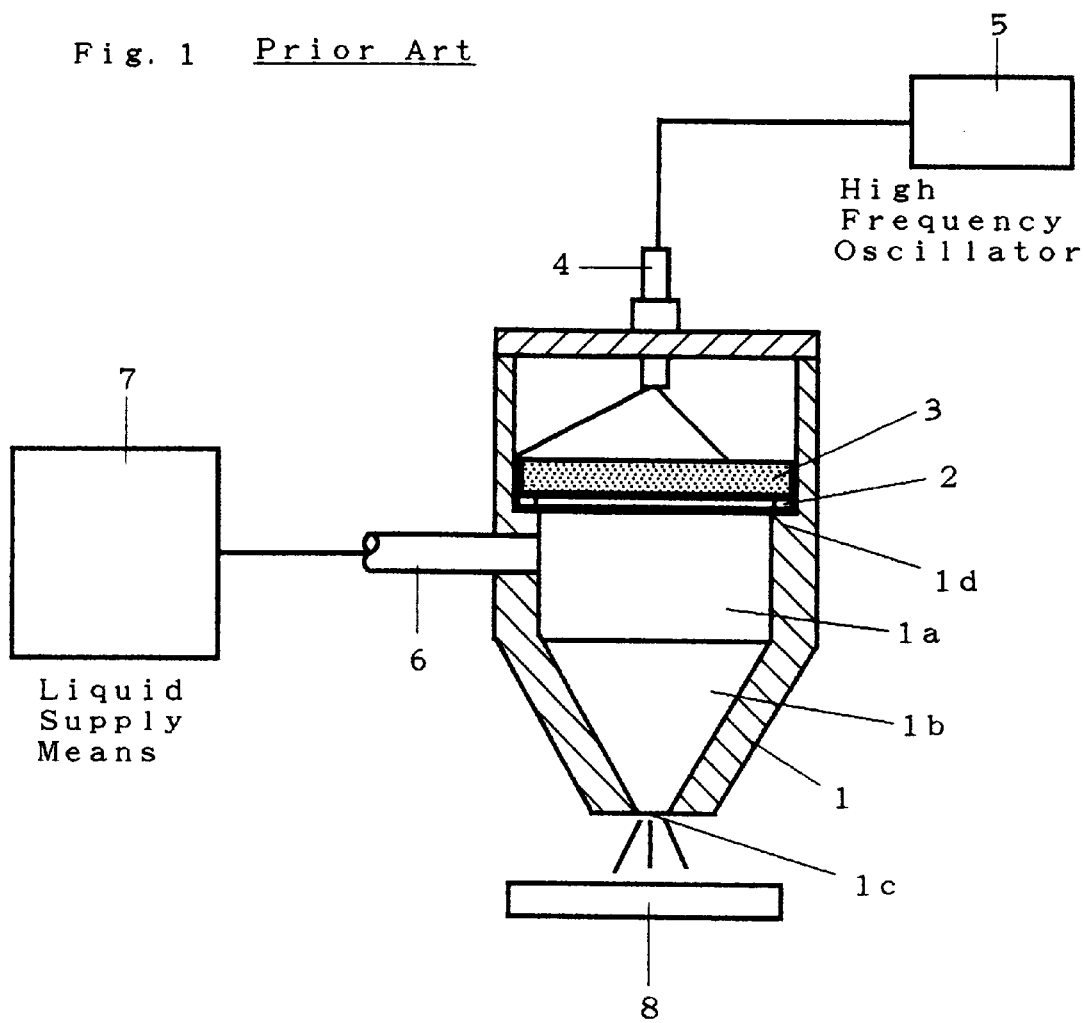
FIG. 1 is a schematic longitudinal cross-sectional view and block diagram of an ultrasonic washing apparatus according to the prior art.

As shown in FIG. 1, a housing 1 has a central hollow portion 1a and an inclined hollow portion 1b, A nozzle 1c is formed at the end of the inclined portion, and a step portion 1d is formed at an inner wall of the central hollow portion 1a.

An ultrasonic vibrator 3 is attached to the step portion 1d of the housing 1 through a packing 2, A high frequency oscillator 5 is connected to the ultrasonic vibrator 3 though electrically connected lines 4, and a liquid supply inlet 6 is attached to the central hollow portion la of the housing 1 and is connected to a liquid supply means 7.

When a liquid as a washing liquid from the liquid supply means 7 is supplied to the central hollow portion 1a of the housing 1 through the liquid supply inlet 6 and ultrasonic waves from the ultrasonic vibrator are supplied to the central hollow portion 1a by applying high frequency power from the high frequency oscillator 5 to the ultrasonic vibrator 3, the liquid and the ultrasonic waves can wash a surface of an object 8 as a semiconductor, in front of the nozzle 1c of the housing 1.

Figure 2:
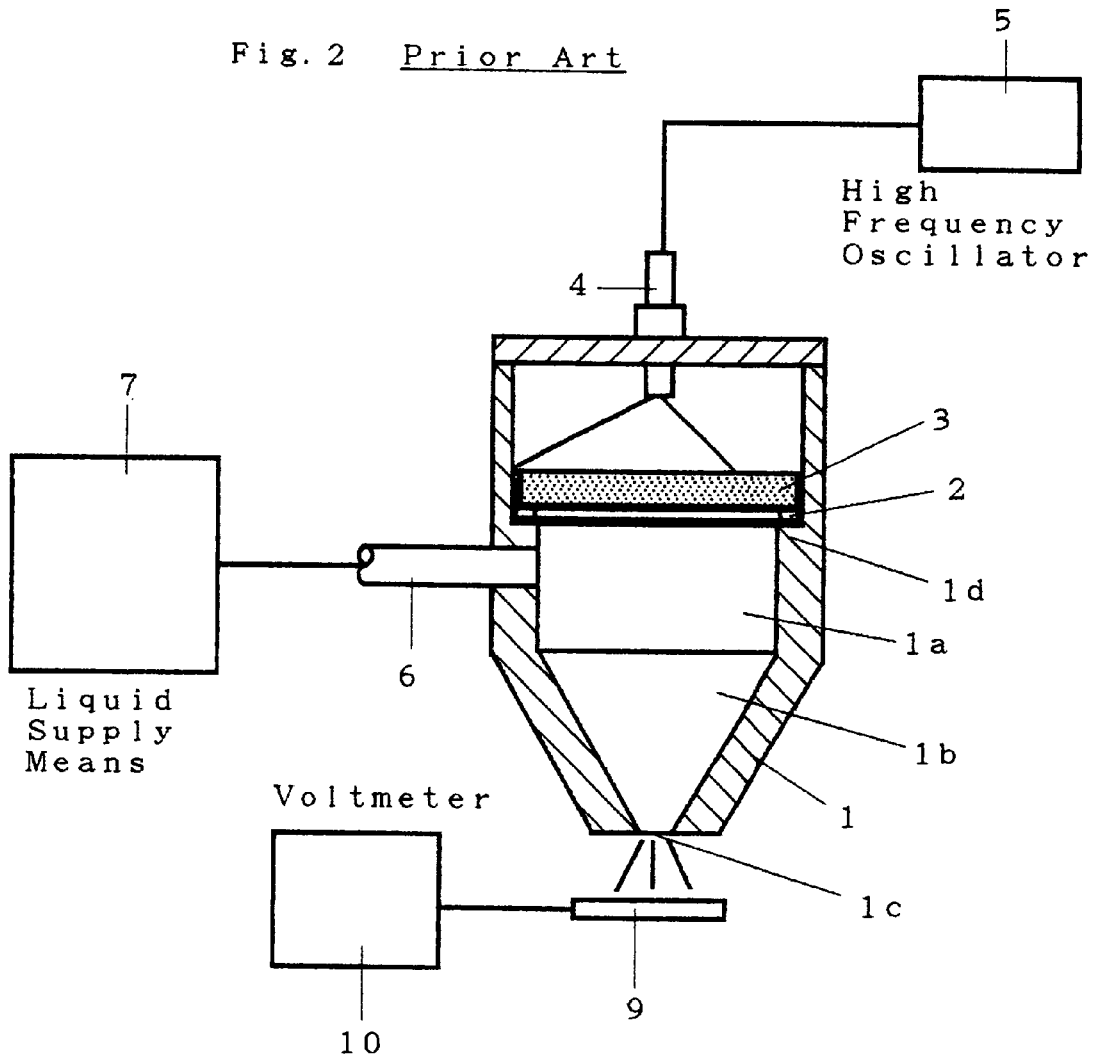
FIG. 2 is a schematic longitudinal cross-sectional view and block diagram similar to FIG. 1, for detecting ultrasonic waves by the ultrasonic washing apparatus of FIG. 1.

In this ultrasonic washing apparatus, since a sound pressure sensor is generally large, for detecting the ultrasonic waves from the nozzle 1c of the housing 1, as shown in FIG. 2, the sound pressure sensor 9 must be set at a setting portion of the object 8 in front of the nozzle 1c of the housing 1. The voltage generated by the sound pressure sensor 9 is detected by a voltmeter 10, and thus the ultrasonic waves from the nozzle 1c of the housing 1 are detected by the voltmeter 10.

Therefore, when the object 8 is washed, the sound pressure sensor 9 cannot be set in front of the nozzle 1c of the housing 1, and it is impossible to watch whether the ultrasonic waves and liquid flow from the nozzle 1c of the housing 1 or not.

Figure 3:
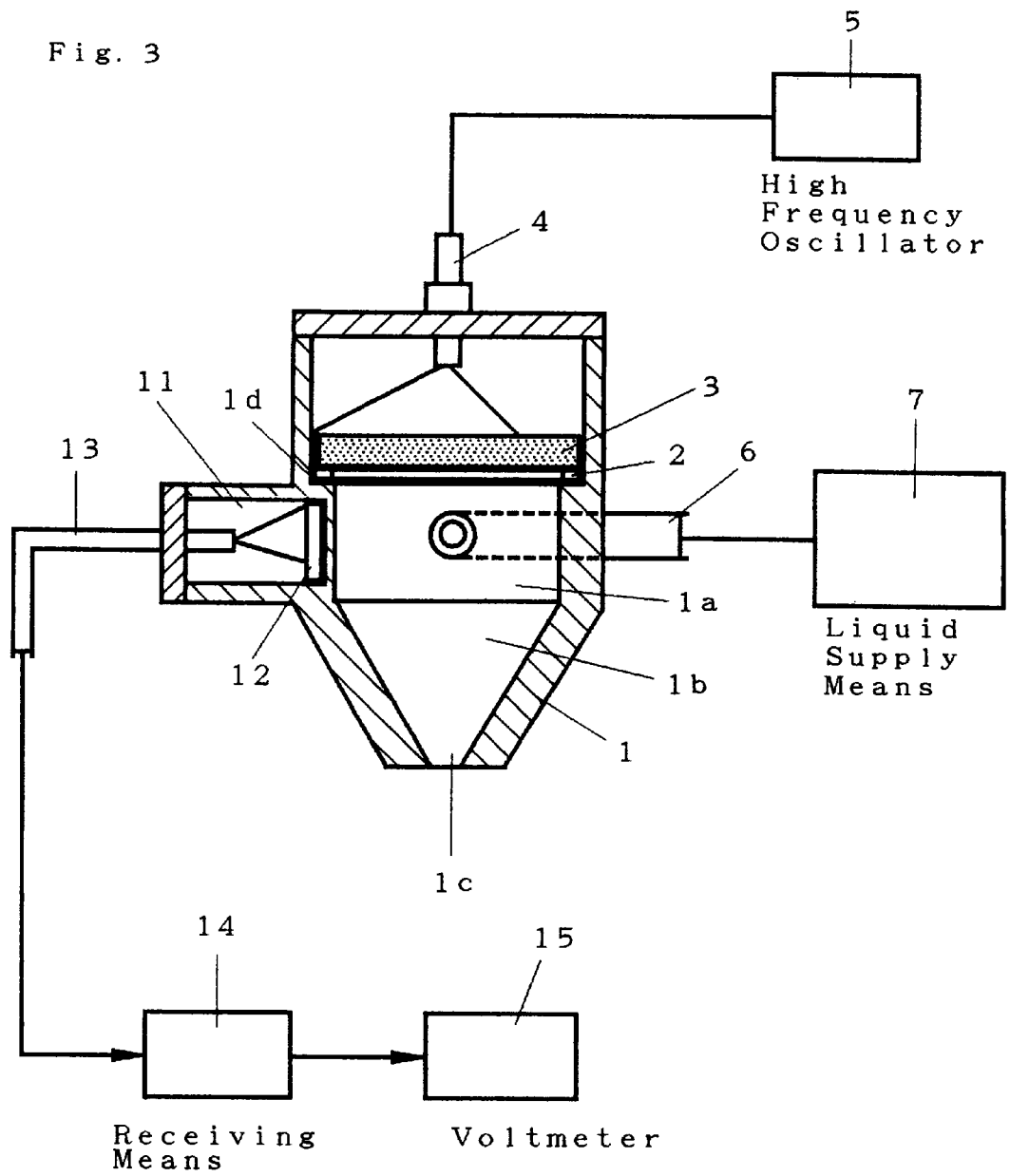
FIG. 3 is a schematic longitudinal cross-sectional view and block diagram of an ultrasonic washing apparatus according to the present invention.

Referring to FIG. 3, 1 designates a housing, 1a a central hollow portion, 1b an inclined hollow portion, 1c a nozzle, 1d a step portion, 2 a packing, 3 an ultrasonic vibrator, 4 electrically connected lines, 5 a high frequency oscillator, 6 a liquid supply inlet, and 7 liquid supply means. Since these elements are the same as those of the above prior art, the explanation of these elements is omitted. In the present embodiment, a sensor chamber 11 is formed at an outter wall of the central hollow portion 1a. A sound pressure sensor 12 is attached to the sensor chamber 11 and is connected to a receiving means 14 through electrically connected lines 13, and the output of the receiving means 14 is connected to the volt meter 15.

In this embodiment of the present invention, when the liquid from the liquid supply means 7 is supplied to the housing 1 through the liquid supply inlet 6, and the high frequency oscillating outputs from the high frequency oscillator 5 are supplied to the ultrasonic vibrator 3 through the electrically connected lines 4, the ultrasonic waves are emitted from the ultrasonic vibrator 3 to the inside of the housing 1 and the ultrasonic waves with liquid are flow from the nozzle 1c of the housing 1.

When the liquid with the ultrasonic waves is flows, the ultrasonic waves from the ultrasonic vibrator 3 are detected by the sound pressure sensor 12, and the sound pressure voltage detected by the sound pressure sensor 12 is amplified by the receiving means 14 and is applied to the voltmeter 15. By watching the sound pressure voltage in the voltmeter 15, it is possible to watch whether ultrasonic waves of a normal value are generated by the ultrasonic vibrator 3 wheather and the liquid is normally supplied to the housing 1 by movement of the indicator of voltmeter 15 or not.

Figure 4:
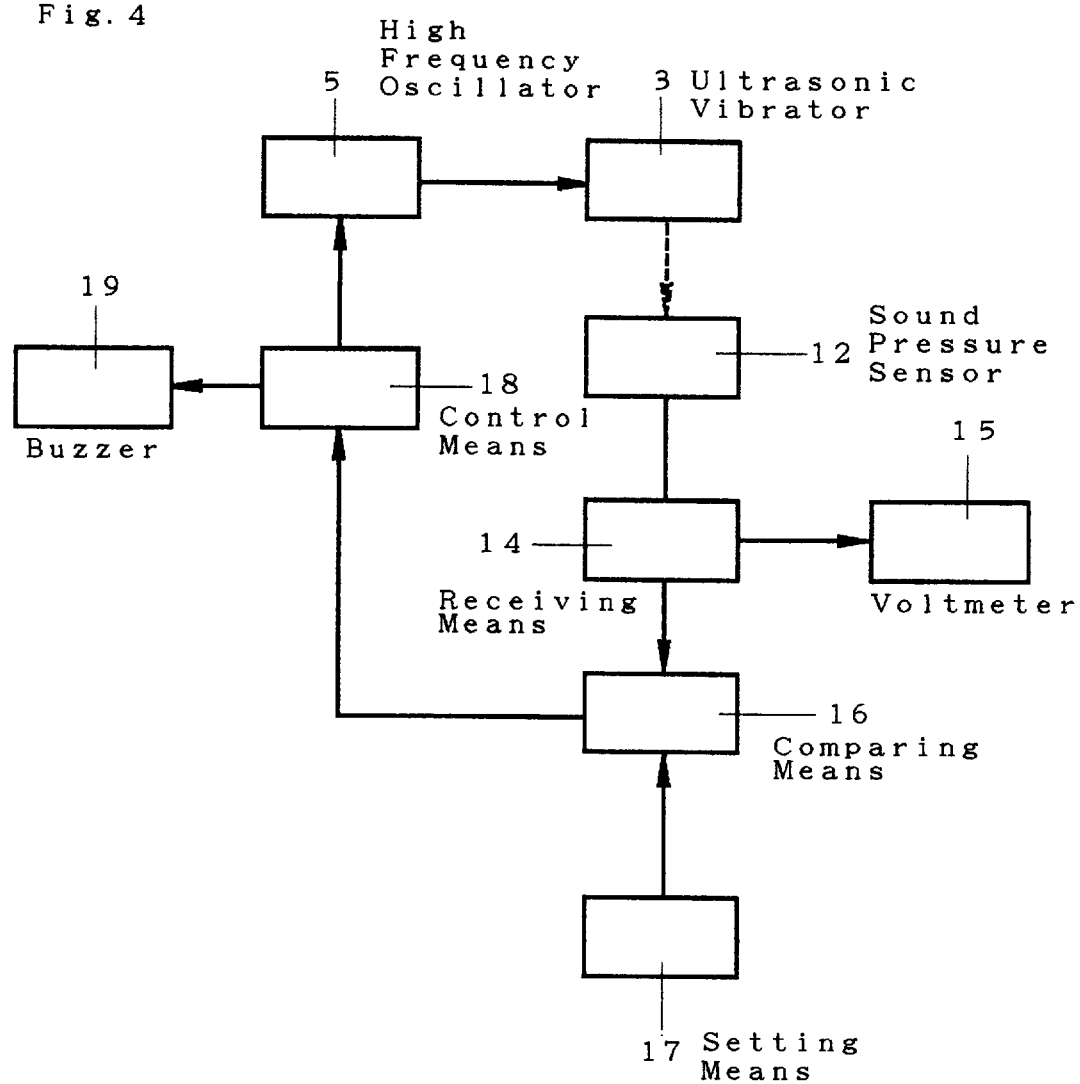
FIG. 4 is a block diagram of the circuity of an ultrasonic washing apparatus according to another embodiment of the present invention.

Referring to FIG. 4, when the ultrasonic waves from ultrasonic vibrator 3 are detected by the sound pressure sensor 12 as shown by a dotted line, the sound pressure voltage of the sound pressure sensor 12 is amplified by the receiving means 14 and is applied to a comparing means 16. Also, since a predetermined voltage in a setting means 17 is applied to the comparing means 16, the output voltage of the sound pressure sensor 12 is compared with the predetermined voltage of the setting means 17. The output of the comparing means 16 is applied to a control means 18, and the output of the control means 18 is applied to the high frequency oscillator 5 and a buzzer 19.

In this ultrasonic washing apparatus of the present invention, the sound pressure of the ultrasonic waves from the ultrasonic vibrator 3 is detected by the sound pressure sensor 12. The output of the sound pressure sensor 12 is amplified by the receiving means 14, is applied to the comparing means 16 and is compared with the predetermined voltage of the setting means 17. Therefore, when the property of the ultrasonic vibrator 3 becomes wrong and the liquid from the liquid supply means 7 is not applied to the housing 1, it is detected that the output voltage of the sound pressure sensor 12 is lower than the predetermined voltage of the setting means 17. Then the output of the comparing means 16 is applied to the control means 18, the high frequency output of the high frequency oscillator 6 is stopped by the output of the control means 18 and the buzzer 19 is sounded. Thus the defect of the ultrasonic vibrator 3 and the stop of the supply of the liquid can be sounded by the buzzer 19.

What is claimed is:

1. An ultrasonic washing apparatus comprising:
    a housing including:
        a central hollow portion having a step portion,
        a liquid supplying inlet opening into said central hollow portion,
        a sensor chamber adjacent the central hollow portion, and
        an inclined hollow portion, one end of which is connected to the central hollow portion and an opposite end of which forms a nozzle,
    an ultrasonic vibrator fixed on the step portion of the central hollow portion,
    a sound pressure sensor attached to the sensor chamber,
    a high frequency oscillator connected to the ultrasonic vibrator,
    a receiving device connected to the sound pressure sensor, and
    a voltmeter connected to the receiving device.

2. An ultrasonic washing apparatus as set forth in claim 1:
    wherein a sound pressure voltage detected by the sound pressure sensor is amplified by the receiving device,
    further comprising:
        a setting device for supplying a predetermined voltage,
        a comparator for comparing the amplified voltage of the receiving device with the predetermined voltage from the setting device and for providing an output, and
        a control unit receiving the output of the comparator and supplying an output of the control unit to the high frequency oscillator,
        whereby an output of the high frequency oscillator is stopped by the output of the control unit in response to the output of the comparator when the sound pressure voltage of the ultrasonic waves from the ultrasonic vibrator becomes less than the predetermined voltage of the setting device.

3. An ultrasonic washing apparatus as set forth in claim 2 wherein a buzzer is sounded by the output of the control unit in response to the output of the comparator when the sound pressure voltage of the ultrasonic vibrator becomes less than the predetermined voltage of the setting device.

* * * * *